US010407771B2

(12) United States Patent
Cui et al.

(10) Patent No.: US 10,407,771 B2
(45) Date of Patent: Sep. 10, 2019

(54) ATOMIC LAYER DEPOSITION CHAMBER WITH THERMAL LID

(71) Applicant: APPLIED MATERIALS, INC., Santa Clara, CA (US)

(72) Inventors: Anqing Cui, Palo Alto, CA (US); Faruk Gungor, San Jose, CA (US); Dien-Yeh Wu, San Jose, CA (US); Vikas Jangra, Bangalore (IN); Muhammad M. Rasheed, San Jose, CA (US); Wei V. Tang, Santa Clara, CA (US); Yixiong Yang, Santa Clara, CA (US); Xiaoxiong Yuan, San Jose, CA (US); Kyoung-Ho Bu, Pleasanton, CA (US); Srinivas Gandikota, Santa Clara, CA (US); Yu Chang, San Jose, CA (US); William W. Kuang, Sunnyvale, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 749 days.

(21) Appl. No.: 14/507,780

(22) Filed: Oct. 6, 2014

(65) Prior Publication Data

US 2016/0097119 A1 Apr. 7, 2016

(51) Int. Cl.
*C23C 16/40* (2006.01)
*C23C 16/44* (2006.01)
(Continued)

(52) U.S. Cl.
CPC ........ *C23C 16/4405* (2013.01); *C23C 16/452* (2013.01); *C23C 16/4558* (2013.01);
(Continued)

(58) Field of Classification Search
CPC .......... C23C 16/4405; C23C 16/45565; C23C 16/452; C23C 16/4558; C23C 16/45506;
(Continued)

(56) References Cited

U.S. PATENT DOCUMENTS 5,186,120 A * 2/1993 Ohnishi ............. C23C 16/4481
118/667
5,256,205 A * 10/1993 Schmitt, III .......... C23C 16/452
118/718
(Continued)

FOREIGN PATENT DOCUMENTS

EP 0855452 A1 7/1998

OTHER PUBLICATIONS

International Search Report and Written Opinion dated Dec. 28, 2015 for PCT Application No. PCT/US2015/050661.
(Continued)

*Primary Examiner* — Rudy Zervigon
(74) *Attorney, Agent, or Firm* — Moser Taboada; Alan Taboada

(57) ABSTRACT

Methods and apparatus for cleaning an atomic layer deposition chamber are provided herein. In some embodiments, a chamber lid assembly includes: a housing enclosing a central channel that extends along a central axis and has an upper portion and a lower portion; a lid plate coupled to the housing and having a contoured bottom surface that extends downwardly and outwardly from a central opening coupled to the lower portion of the central channel to a peripheral portion of the lid plate; a first heating element to heat the central channel; a second heating element to heat the bottom surface of the lid plate; a remote plasma source fluidly coupled to the central channel; and an isolation collar coupled between the remote plasma source and the housing, wherein the isolation collar has an inner channel extending
(Continued)

through the isolation collar to fluidly couple the remote plasma source and the central channel.

18 Claims, 11 Drawing Sheets

(51) Int. Cl.
*C23C 16/455* (2006.01)
*H01J 37/32* (2006.01)
*C23C 16/452* (2006.01)

(52) U.S. Cl.
CPC .. *C23C 16/45506* (2013.01); *C23C 16/45536* (2013.01); *C23C 16/45544* (2013.01); *C23C 16/45563* (2013.01); *C23C 16/45565* (2013.01); *H01J 37/32357* (2013.01); *H01J 37/32522* (2013.01); *H01J 37/32862* (2013.01)

(58) Field of Classification Search
CPC ........ C23C 16/45563; C23C 16/45544; C23C 16/45536; H01J 37/32522; H01J 37/32357; H01J 37/32862
USPC .............. 118/723 MW, 723 ME, 723 MR, 118/723 MA, 723 ER, 723 IR, 723 R; 156/345.35, 345.36
See application file for complete search history.

(56) References Cited

U.S. PATENT DOCUMENTS

| | | | |
|---|---|---|---|
| 5,728,222 A * | 3/1998 | Barbee | C23C 16/403 118/715 |
| 5,935,334 A * | 8/1999 | Fong | H01J 37/32192 118/723 ME |
| 6,051,286 A | 4/2000 | Zhao et al. | |
| 6,143,077 A * | 11/2000 | Ikeda | C23C 16/45572 118/715 |
| 6,287,643 B1 * | 9/2001 | Powell | C23C 16/452 118/723 ME |
| 6,433,314 B1 | 8/2002 | Mandrekar et al. | |
| 7,204,886 B2 * | 4/2007 | Chen | C23C 16/45502 118/715 |
| 7,294,207 B2 * | 11/2007 | Strauch | C23C 16/45508 118/715 |
| 7,402,210 B2 * | 7/2008 | Chen | C23C 16/45502 118/715 |
| 7,591,907 B2 * | 9/2009 | Chen | C23C 16/45502 118/715 |
| 7,718,004 B2 * | 5/2010 | Satoh | C23C 16/4405 118/715 |
| 7,780,789 B2 * | 8/2010 | Wu | C23C 16/34 118/715 |
| 7,794,544 B2 * | 9/2010 | Nguyen | C23C 16/0272 118/715 |
| 7,850,779 B2 * | 12/2010 | Ma | C23C 16/18 118/715 |
| 8,070,879 B2 * | 12/2011 | Chen | C23C 16/45502 118/715 |
| 8,137,467 B2 * | 3/2012 | Meinhold | C23C 16/45565 118/663 |
| 8,187,381 B2 * | 5/2012 | Sangam | C23C 16/405 117/200 |
| 8,282,992 B2 * | 10/2012 | Myo | C23C 16/0272 427/248.1 |
| 8,343,279 B2 * | 1/2013 | Myo | C23C 16/0272 118/723 MW |
| 8,382,897 B2 * | 2/2013 | Sangam | C23C 16/405 117/93 |
| 8,419,854 B2 * | 4/2013 | Hatanaka | C23C 16/30 118/715 |
| 8,673,080 B2 * | 3/2014 | Meinhold | C23C 16/45565 118/724 |
| 8,778,079 B2 * | 7/2014 | Begarney | C23C 16/45508 118/715 |
| 9,018,689 B1 * | 4/2015 | Hirochi | H01L 21/02274 257/307 |
| 9,032,906 B2 * | 5/2015 | Ma | C23C 16/18 118/715 |
| 9,132,436 B2 * | 9/2015 | Liang | B05B 1/005 |
| 9,175,394 B2 * | 11/2015 | Yudovsky | C23C 16/45504 |
| 9,441,296 B2 * | 9/2016 | Sabri | C23C 16/45565 |
| 9,476,120 B2 * | 10/2016 | Meinhold | C23C 16/45565 |
| 9,487,863 B2 * | 11/2016 | Matsui | C23C 16/4412 |
| 9,518,321 B2 * | 12/2016 | Tanabe | C23C 16/4411 |
| 9,677,176 B2 * | 6/2017 | Chandrasekharan | C23C 16/45565 |
| 2002/0192370 A1 | 12/2002 | Metzner et al. | |
| 2005/0252449 A1 * | 11/2005 | Nguyen | C23C 16/0272 118/715 |
| 2005/0271812 A1 * | 12/2005 | Myo | C23C 16/0272 427/248.1 |
| 2005/0271813 A1 * | 12/2005 | Kher | C23C 16/0272 427/248.1 |
| 2006/0027249 A1 * | 2/2006 | Johnson | C23C 16/4405 134/1.1 |
| 2006/0133955 A1 * | 6/2006 | Peters | C23C 16/4481 422/63 |
| 2006/0137608 A1 * | 6/2006 | Choi | C23C 16/14 118/715 |
| 2007/0119370 A1 * | 5/2007 | Ma | C23C 16/18 118/723 E |
| 2007/0128863 A1 * | 6/2007 | Ma | C23C 16/18 438/680 |
| 2008/0041308 A1 | 2/2008 | Hong et al. | |
| 2008/0053614 A1 | 3/2008 | Sago et al. | |
| 2008/0063798 A1 * | 3/2008 | Kher | C23C 16/34 427/255.394 |
| 2008/0102203 A1 * | 5/2008 | Wu | C23C 16/34 427/248.1 |
| 2008/0102208 A1 * | 5/2008 | Wu | C23C 16/4404 427/255.28 |
| 2008/0107809 A1 * | 5/2008 | Wu | C23C 16/34 427/248.1 |
| 2008/0115801 A1 | 5/2008 | Chin et al. | |
| 2009/0000550 A1 | 1/2009 | Tran et al. | |
| 2009/0084317 A1 * | 4/2009 | Wu | C23C 16/45563 118/728 |
| 2009/0095218 A1 * | 4/2009 | Meinhold | C23C 16/45565 118/708 |
| 2009/0095219 A1 * | 4/2009 | Meinhold | C23C 16/45565 118/708 |
| 2009/0095220 A1 * | 4/2009 | Meinhold | C23C 16/45565 118/712 |
| 2009/0183833 A1 | 7/2009 | Kim | |
| 2011/0223334 A1 * | 9/2011 | Yudovsky | C23C 16/45504 427/255.23 |
| 2011/0226178 A1 * | 9/2011 | Tsuji | C23C 16/45517 118/50 |
| 2014/0097270 A1 | 4/2014 | Liang et al. | |
| 2015/0376784 A1 * | 12/2015 | Wu | C23C 16/45508 427/255.28 |
| 2016/0097119 A1 * | 4/2016 | Cui | H01J 37/32357 134/1.1 |
| 2016/0186319 A1 * | 6/2016 | Spangler | C23C 16/4409 118/715 |
| 2016/0230280 A1 * | 8/2016 | Matsui | C23C 16/4412 |
| 2016/0284517 A1 * | 9/2016 | Saido | H01J 37/3244 |
| 2016/0312360 A1 * | 10/2016 | Rasheed | C23C 16/45544 |
| 2017/0159181 A1 * | 6/2017 | Toyoda | C23C 16/4412 |
| 2019/0048467 A1 * | 2/2019 | Sanchez | C23C 16/4405 |

OTHER PUBLICATIONS

Search Report from the State Intellectual Property Office of the People's Republic of China for Chinese Application No. 2015800542563 dated Jan. 27, 2019.

(56) References Cited

OTHER PUBLICATIONS

Supplementary European Search Report abd European search opinion dated Apr. 16, 2018 received for application EP 15 84 9170.

* cited by examiner

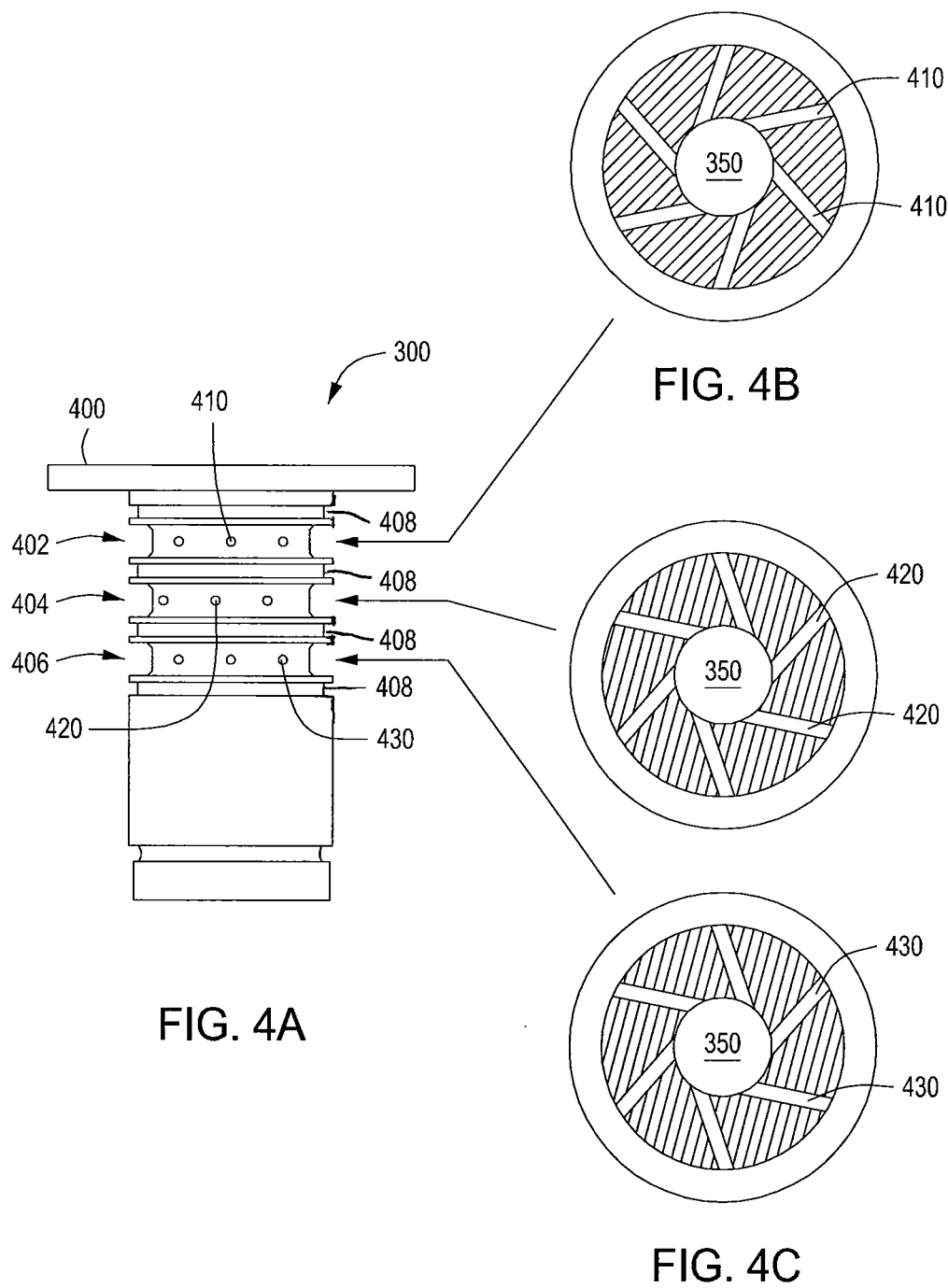

ATOMIC LAYER DEPOSITION CHAMBER WITH THERMAL LID

FIELD

Embodiments of the disclosure generally relate to apparatus and methods for atomic layer deposition.

BACKGROUND

Reliably producing submicron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology use precise processing of high aspect ratio features, such as vias and other interconnects. Reliable formation of these interconnects is very important to VLSI and ULSI success and to the continued effort to increase circuit density and quality of individual substrates.

As circuit densities increase, the widths of interconnects, such as vias, trenches, contacts, and other features, as well as the dielectric materials between, decrease while the thickness of the dielectric layers remain substantially constant, resulting in increased height-to-width aspect ratios of the features. Many traditional deposition processes have difficulty filling submicron structures where the aspect ratio exceeds 4:1, and particularly where the aspect ratio exceeds 10:1. Therefore, there is a great amount of ongoing effort being directed at the formation of substantially void-free and seam-free submicron features having high aspect ratios.

Atomic layer deposition (ALD) is a deposition technique being explored for the deposition of material layers over features having high aspect ratios. One example of an ALD process includes the sequential introduction of pulses of gases. For instance, one cycle for the sequential introduction of pulses of gases may contain a pulse of a first reactant gas, followed by a pulse of a purge gas and/or a pump evacuation, followed by a pulse of a second reactant gas, and followed by a pulse of a purge gas and/or a pump evacuation. The term "gas" as used herein is defined to include a single gas or a plurality of gases. Sequential introduction of separate pulses of the first reactant and the second reactant may result in the alternating self-limiting absorption of monolayers of the reactants on the surface of the substrate and, thus, forms a monolayer of material for each cycle. The cycle may be repeated to a desired thickness of the deposited material. A pulse of a purge gas and/or a pump evacuation between the pulses of the first reactant gas and the pulses of the second reactant gas serves to reduce the likelihood of gas phase reactions of the reactants due to excess amounts of the reactants remaining in the chamber. However, the inventors have observed that, in some chamber designs for ALD processing, the resultant deposition on the substrate has an "M" shaped thickness profile. The inventors have also observed that during the introduction of the gases, byproducts may build up on the chamber components and flake off onto a substrate being processed.

Therefore, the inventors have provided apparatus and methods to clean an ALD chamber.

SUMMARY

Methods and apparatus for cleaning an atomic layer deposition chamber are provided herein. In some embodiments, a chamber lid assembly includes: a housing enclosing a central channel that extends along a central axis and has an upper portion and a lower portion; a lid plate coupled to the housing and having a contoured bottom surface that extends downwardly and outwardly from a central opening coupled to the lower portion of the central channel to a peripheral portion of the lid plate; a first heating element to heat the central channel; a second heating element to heat the bottom surface of the lid plate; a remote plasma source fluidly coupled to the central channel; and an isolation collar coupled between the remote plasma source and the housing, wherein the isolation collar has an inner channel extending through the isolation collar to fluidly couple the remote plasma source and the central channel.

In some embodiments, a substrate processing chamber includes: a chamber body; and a chamber lid assembly coupled to the chamber body to define a processing volume within the chamber body and beneath the chamber lid assembly. The chamber lid assembly may include: a housing enclosing a central channel that extends along a central axis and has an upper portion and a lower portion; a lid plate coupled to the housing and having a contoured bottom surface that extends downwardly and outwardly from a central opening coupled to the lower portion of the central channel to a peripheral portion of the lid plate; a first heating element to heat the central channel; a second heating element to heat the bottom surface of the lid plate; a remote plasma source fluidly coupled to the central channel; and an isolation collar coupled between the remote plasma source and the housing, wherein the isolation collar has an inner channel extending through the isolation collar to fluidly couple the remote plasma source and the central channel.

In some embodiments, a method of cleaning a process chamber includes: providing a cleaning gas to a remote plasma source; forming a plasma from the cleaning gas; flowing the plasma from the remote plasma source through an isolation collar and into a central channel and a reaction zone of a chamber lid assembly to vaporize byproducts on walls of the chamber lid assembly; and heating the chamber lid assembly to a predetermined temperature while the plasma is flowed into the central channel and the reaction zone.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

FIG. 4A depicts a side view of an insert for a lid assembly and a gas delivery apparatus adapted for atomic layer deposition in accordance with some embodiments of the present disclosure.

FIGS. 4B and 4C each depict cross-sectional top views of a horizontal cross-section of the insert of FIG. 4A in accordance with some embodiments of the present disclosure.

Figure 1A:
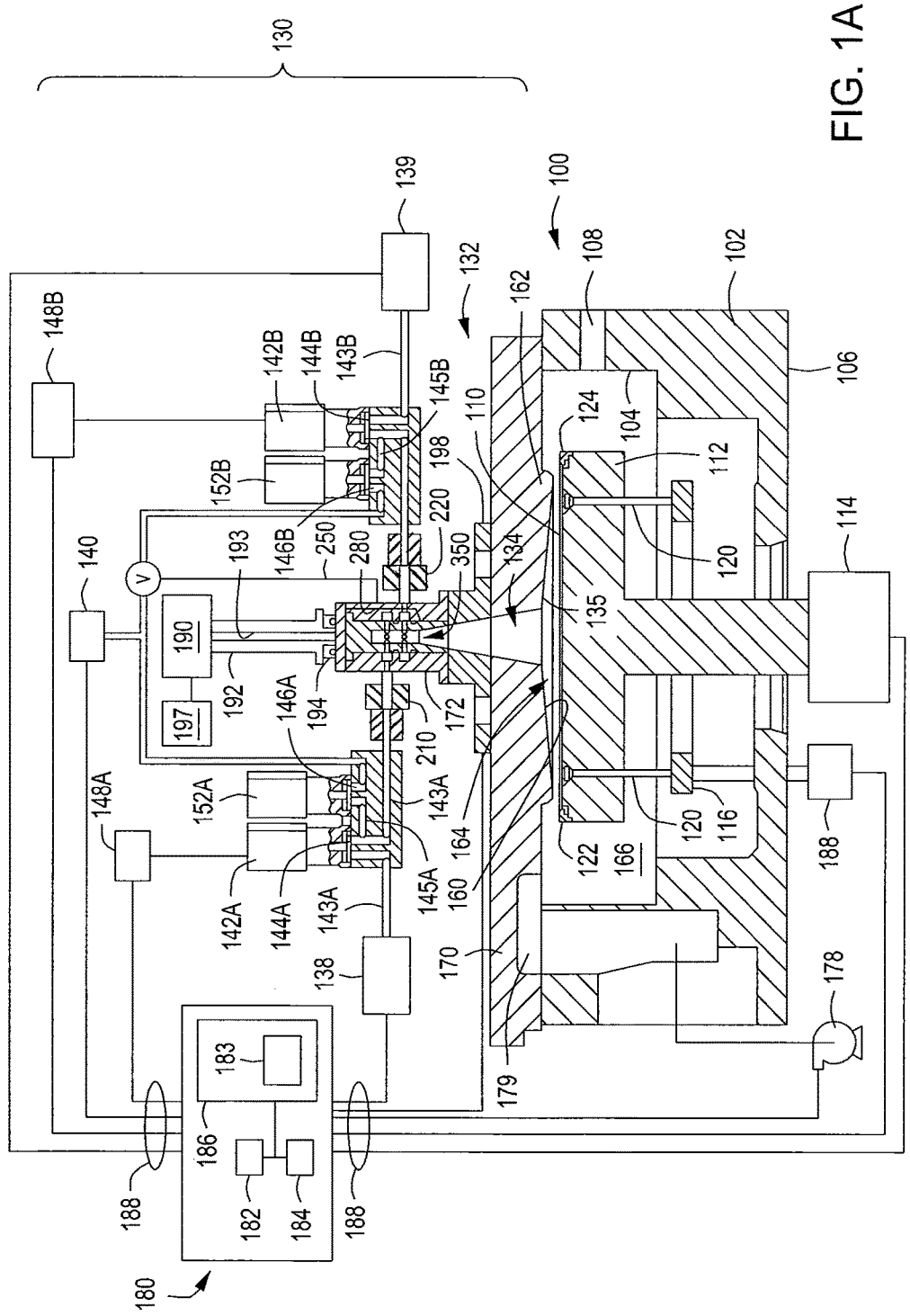
FIG. 1A depicts a schematic cross-sectional view of a process chamber including a lid assembly and a gas delivery apparatus adapted for atomic layer deposition as described in one embodiment herein.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure provide apparatus and methods that may be used to clean substrate processing chambers, such as an atomic layer deposition (ALD) chamber, and to deposit materials during, for example, an ALD process. Embodiments include substrate processing chambers and gas delivery systems which include a remote plasma source and a multiple injection lid assembly. Other embodiments provide methods for depositing materials using these gas delivery systems during ALD processes. Examples of suitable processing chambers for incorporation of the apparatuses described herein include high dielectric constant (i.e., high k) and metal ALD deposition chambers available from Applied Materials, Inc., of Santa Clara, Calif. The following process chamber description is provided for context and exemplary purposes, and should not be interpreted or construed as limiting the scope of the disclosure.

Figure 1B:
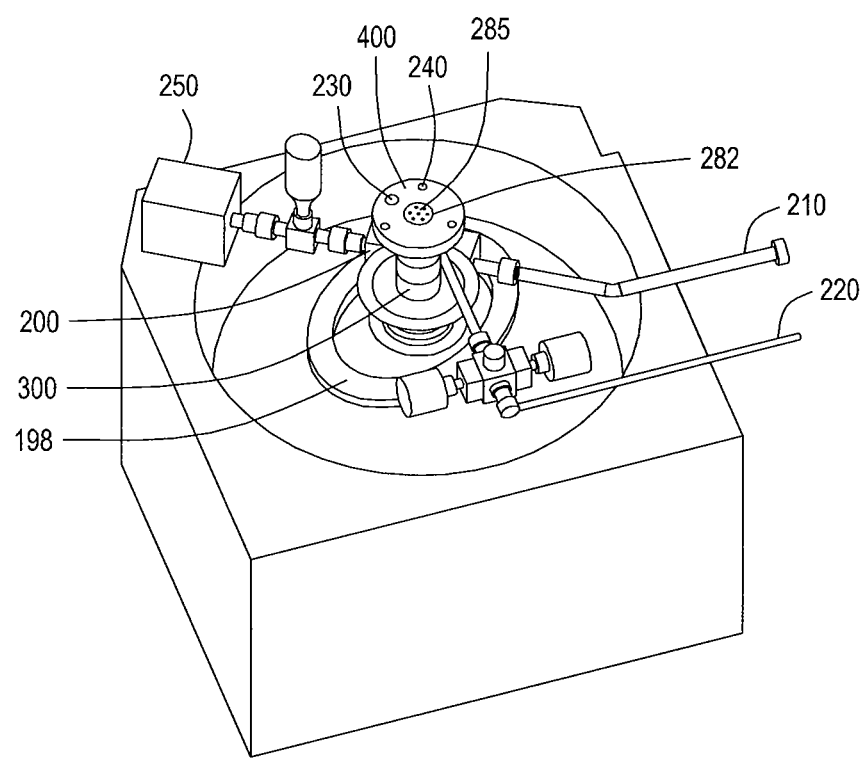
FIG. 1B depicts a perspective view of a top portion of the lid assembly and a gas delivery apparatus adapted for atomic layer deposition as described in one embodiment herein.
Figure 1C:
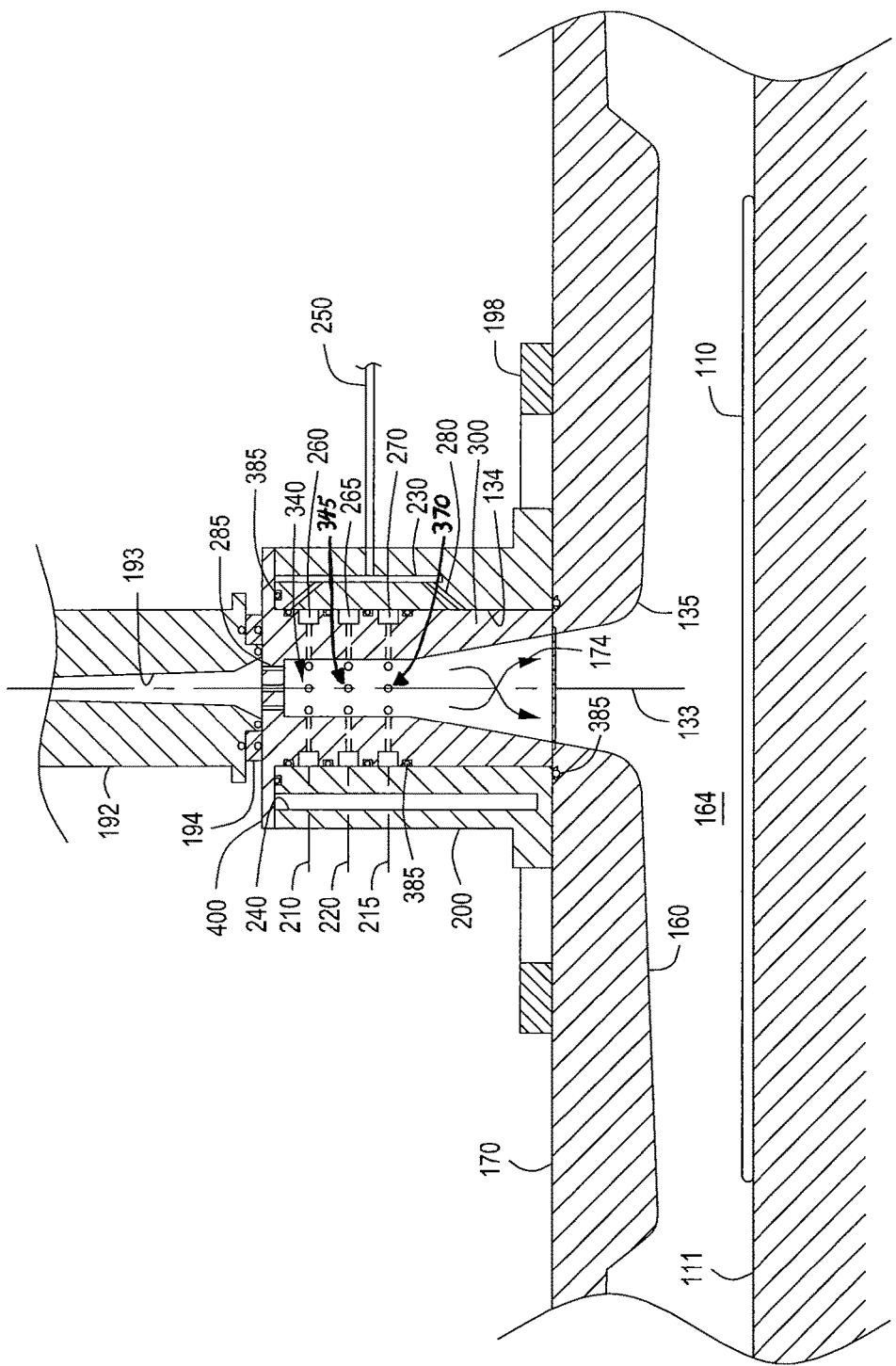
FIG. 1C a schematic cross-sectional view of a lid assembly and a gas delivery apparatus adapted for atomic layer deposition in accordance with some embodiments of the present disclosure.

FIGS. 1A and 1B are schematic views of a substrate processing chamber (process chamber 100) including a gas delivery system 130 adapted for ALD processes in accordance with some embodiments of the present disclosure. FIG. 1C is a schematic view of the process chamber 100 including another embodiment of the gas delivery system 130. Process chamber 100 includes a chamber body 102 having one or more sidewalls 104 and a bottom 106. A chamber lid assembly 132 is disposed atop the chamber body 102 to define a processing volume within the chamber body 102 and beneath the chamber lid assembly 132. Slit valve 108 in the process chamber 100 provides access for a robot (not shown) to deliver and retrieve a substrate 110, such as a 200 mm or 300 mm semiconductor wafer or a glass substrate, to and from the process chamber 100.

A substrate support 112 supports the substrate 110 on a substrate receiving surface 111 in the process chamber 100. The substrate support 112 is mounted to a lift motor 114 for raising and lowering the substrate support 112 and the substrate 110 disposed thereon. A lift plate 116, connected to a lift motor 118, is mounted in the process chamber 100 to raise and lower lift pins 120 movably disposed through the substrate support 112. The lift pins 120 raise and lower the substrate 110 over the surface of the substrate support 112. The substrate support 112 may include a vacuum chuck (not shown), an electrostatic chuck (not shown), or a clamp ring (not shown) for securing the substrate 110 to the substrate support 112 during a deposition process.

The temperature of the substrate support 112 may be adjusted to control the temperature of the substrate 110 disposed thereon. For example, substrate support 112 may be heated using an embedded heating element, such as a resistive heater (not shown), or may be heated using radiant heat, such as heating lamps (not shown) disposed above the substrate support 112. A purge ring 122 may be disposed on the substrate support 112 to define a purge channel 124 which provides a purge gas to a peripheral portion of the substrate 110 to prevent deposition thereon.

Gas delivery system 130 is disposed at an upper portion of the chamber body 102 to provide a gas, such as a process gas and/or a purge gas, to process chamber 100. FIGS. 1 and 2A-2G depict a gas delivery system 130 configured to expose the substrate 110 to at least two gas sources or chemical precursors. A vacuum system 178 is in communication with the pumping channel 179 to evacuate any desired gases from the process chamber 100 and to help maintain a desired pressure or pressure range inside pumping zone 166 of the process chamber 100.

In some embodiments, the gas delivery system 130 includes a gas dispersing channel 134 extending through a central portion of the chamber lid assembly 132. As shown in FIG. 1C, the gas dispersing channel 134 extends perpendicularly toward the substrate receiving surface 111 and also extends along central axis 133 of the gas dispersing channel 134, through lid plate 170, and to lower surface 160. In some embodiments, a portion of the gas dispersing channel 134 is substantially cylindrical along central axis 133 within upper portion 350 and a portion of the gas dispersing channel 134 tapers away from central axis 133 within lower portion 135 of the gas dispersing channel 134. The gas dispersing channel 134 further extends past lower surface 160 and into a reaction zone 164. The lower surface 160 extends from the lower portion 135 of the gas dispersing channel 134 to a choke 162. The lower surface 160 is sized and shaped to substantially cover the substrate 110 disposed on the substrate receiving surface 111 of the substrate support 112. The lower surface 160 tapers from an outer edge of the lid plate 170 towards the gas dispersing channel 134.

Gas flows 174, which illustrate the flow of process gases through the dispersing channel, may contain various types of flow patterns. In some embodiments, processing gases may be forced to make revolutions around central axis 133 of gas dispersing channel 134 while passing through the dispersing channel. In such embodiments, the gas flows 174 may contain various types of circular flow patterns, such as a vortex pattern, a helix pattern, a spiral pattern, or derivatives thereof.

Although providing a circular gas flow 174 is beneficial for many applications, the inventors have discovered that in some applications, the circular gas flow can lead to non-uniform processing results. As such, in some embodiments, the gas flows 174 may be more turbulent to provide enhanced mixing of two or more gases. The inventors have observed that by providing the gas flow 174 with a more turbulent mixing, deposition uniformity can be improved in some applications. For example, in certain applications that result in an "m" shaped deposition profile when using a circular gas flow, with a low deposition rate in the center and higher deposition rate in the region between the center and the edge of the substrate, providing turbulent mixing can advantageously result in improved deposition uniformity.

Gas dispersing channel 134 includes an upper portion with gas inlets 340, 345, 370 to provide gas flows from two similar pairs of valves 142A/152A, 142B/152B, which may be provided together or separately. In one configuration, valve 142A and valve 142B are coupled to separate reactant gas sources but are preferably coupled to the same purge gas source. For example, valve 142A is coupled to reactant gas source 138 and valve 142B is coupled to reactant gas source 139, and both valves 142A, 142B are coupled to purge gas source 140. Each valve 142A, 142B includes delivery line 143A, 143B having valve seat assembly 144A, 144B and each valve 152A, 152B includes purge line 145A, 145B having valve seat assembly 146A, 146B. Delivery line 143A, 143B is in fluid communication with reactant gas sources 138 and 139 and is in fluid communication with gas inlet 340, 345, 370 of gas dispersing channel 134. Valve seat assembly 144A, 144B of the delivery line 143A, 143B controls the flow of the reactant gas from reactant gas sources 138 and 139 to gas dispersing channel 134. Purge line 145A, 145B is in communication with purge gas source 140 and intersects delivery line 143A, 143B downstream of valve seat assembly 144A, 144B of delivery line 143A, 143B. Valve seat assembly 146A, 146B of purge line 145A, 145B controls the flow of the purge gas from purge gas source 140 to gas dispersing channel 134. If a carrier gas is used to deliver reactant gases from reactant gas sources 138 and 139, preferably the same gas is used as a carrier gas and a purge gas (e.g., an argon gas used as a carrier gas and a purge gas).

Each valve seat assembly 144A, 144B, 146A, 146B may contain a diaphragm (not shown) and a valve seat (not shown). The diaphragm may be biased open or closed and may be actuated closed or open respectively. The diaphragms may be pneumatically actuated or may be electrically actuated. Pneumatically actuated valves include pneumatically actuated valves available from Fujikin, Inc. and Veriflo Division, Parker Hannifin, Corp. Electrically actuated valves include electrically actuated valves available from Fujikin, Inc. For example, an ALD valve that may be used is the Fujikin Model No. FPR-UDDFAT-21-6.35-PI-ASN or the Fujikin Model No. FPR-NHDT-21-6.35-PA-AYT. Programmable logic controllers 148A, 148B may be coupled to valves 142A, 142B to control actuation of the diaphragms of valve seat assemblies 144A, 144B, 146A, 146B of valves 142A, 142B. Pneumatically actuated valves may provide pulses of gases in time periods as low as about 0.020 seconds. Electrically actuated valves may provide pulses of gases in time periods as low as about 0.005 seconds. An electrically actuated valve typically utilizes a driver coupled between the valve and the programmable logic controller.

Each valve 142A, 142B may be a zero dead volume valve to enable flushing of a reactant gas from delivery line 143A, 143B when valve seat assembly 144A, 144B is closed. For example, purge line 145A, 145B may be positioned adjacent valve seat assembly 144A, 144B of delivery line 143A, 143B. When valve seat assembly 144A, 144B is closed, purge line 145A, 145B may provide a purge gas to flush delivery line 143A, 143B. In one embodiment, purge line 145A, 145B is positioned slightly spaced from valve seat assembly 144A, 144B of delivery line 143A, 143B so that a purge gas is not directly delivered into valve seat assembly 144A, 144B when open. A zero dead volume valve as used herein is defined as a valve which has negligible dead volume (i.e., not necessarily zero dead volume).

Each valve pair 142A/152A, 142B/152B may be adapted to provide a combined gas flow and/or separate gas flows of the reactant gas and the purge gas. In reference to valve pair 142A/152A, one example of a combined gas flow of the reactant gas and the purge gas includes a continuous flow of a purge gas from purge gas source 140 through purge line 145A and pulses of a reactant gas from reactant gas source 138 through delivery line 143A. The continuous flow of the purge gas may be provided by leaving the diaphragm of valve seat assembly 146A of purge line 145A open. The pulses of the reactant gas from reactant gas source 138 may be provided by opening and closing the diaphragm of valve seat assembly 144A of delivery line 143A. In reference to valve pair 142A/152A, one example of separate gas flows of the reactant gas and the purge gas includes pulses of a purge gas from purge gas source 140 through purge line 145A and pulses of a reactant gas from reactant gas source 138 through delivery line 143A. The pulses of the purge gas may be provided by opening and closing the diaphragm of the valve seat assembly 146A of purge line 145A. The pulses of the reactant gas from reactant gas source 138 may be provided by opening and closing the diaphragm of valve seat assembly 144A of delivery line 143A.

Delivery lines 143A, 143B of valves 142A, 142B may be coupled with gas inlets 340, 345, 370 through fluid delivery lines 210, 220, 215 and annular channels 260, 265, 270.

Fluid delivery lines 210, 220, 215 may be integrated or may be separate from valves 142A, 142B, and thus connected to one or more fluid sources. In one aspect, valves 142A, 142B are coupled in close proximity to gas dispersing channel 134 to reduce any unnecessary volume of delivery line 143A, 143B and fluid delivery lines 210, 220, 215 between valves 142A, 142B and gas inlets 340, 345, 370.

Not wishing to be bound by theory, it is believed that the diameter of gas dispersing channel 134, which is constant from the upper portion of gas dispersing channel 134 to some point along central axis 133 and increasing from this point to lower portion 135 of gas dispersing channel 134, allows less of an adiabatic expansion of a gas through gas dispersing channel 134 which helps to control the temperature of the process gas contained in the gas flow 174. For instance, a sudden adiabatic expansion of a gas delivered into gas dispersing channel 134 may result in a drop in the temperature of the gas which may cause condensation of the gas and formation of droplets. On the other hand, gas dispersing channel 134 that gradually tapers is believed to provide less of an adiabatic expansion of a gas. Therefore, more heat may be transferred to or from the gas, and, thus, the temperature of the gas may be more easily controlled by controlling the temperature of chamber lid assembly 132. Gas dispersing channel 134 may gradually taper and contain one or more tapered inner surfaces, such as a tapered straight surface, a concave surface, a convex surface, or combinations thereof or may contain sections of one or more tapered inner surfaces (i.e., a portion tapered and a portion non-tapered).

The upper portion of the gas dispersing channel 134 is defined by an insert 300 disposed in a housing 200. A cap 400 may be disposed on the housing 200 and insert 300. The insert 300 and cap 400 include a plurality of o-rings 385 disposed between the insert 300 and the housing 200 to ensure proper sealing.

As depicted in FIG. 1A, the process chamber 100 further includes a chamber cleaning system including a remote plasma source (RPS) 190, an isolation collar 192 coupled to the RPS 190 at one end and the cap 400 at an opposite end, a heater plate 198 coupled to an upper surface of the lid plate 170, and a cleaning gas source 197 fluidly coupled to the RPS 190. The cleaning gas source may include any gas suitable for forming a plasma to clean the process chamber 100. In some embodiments, for example, the cleaning gas may be nitrogen trifluoride ($NF_3$). The heater plate 198 may be formed of stainless steel and include a plurality of resistive heating elements dispersed throughout the plate.

Referring to FIG. 1C, the isolation collar 192 includes an inner channel 193 that is fluidly coupled to the gas dispersing channel 134 through a plurality of holes 285 in a central portion 282 of the cap 400 to flow a plasma from the RPS 190 through the gas dispersing channel 134 and into the reaction zone 164. When a pressure inside of the process chamber 100 exceeds a pressure inside of the RPS 190, processing gasses may flow up to and damage the RPS 190. The plurality of holes 285 serve as a choke point to prevent a backflow of processing gases from flowing up through the inner channel 193 and into the RPS 190. The isolation collar 192 may be formed of any material that is non-reactive with the cleaning gas being used. In some embodiments, the isolation collar 192 may be formed of aluminum when the cleaning gas is $NF_3$. The chamber cleaning system further includes one or more cartridge heaters 240 disposed in the housing 200 to heat the housing 200 to a predetermined temperature. In some embodiments, the predetermined temperature is greater than or equal to 150° C. The housing 200 and the cap 400 may be made of stainless steel.

The RPS 190 operates at a temperature less than or equal to about 40° C. In order advantageously insulate the RPS 190 from heat generated in the housing 200 by the cartridge heaters 240, the inventors have minimized a contact area between the isolation collar 192 and the cap 400. To achieve this insulation, a thermal isolation ring 194 is disposed between the isolation collar 192 and the cap 400. The thermal isolation ring 194 is formed of a metal with low thermal conductivity (e.g., lower than the thermal conductivity of the isolation collar 192 and the cap 400). In some embodiments, for example, the thermal isolation ring 194 is formed of stainless steel. In addition, an o-ring 385 may also be disposed between the isolation collar 192 and the cap 400 to further reduce the contact area between the isolation collar 192 and the cap 400. The combination of the thermal isolation ring 194 and the o-ring 385 acts as a thermal choke to ensure that the heat generating in the housing 200 does not adversely affect the RPS 190. In some embodiments, an upper portion of the isolation collar 192 proximate the RPS 190 may be cooled by flowing a heat transfer medium through channels (not shown) in the isolation collar 192.

Figure 2A:
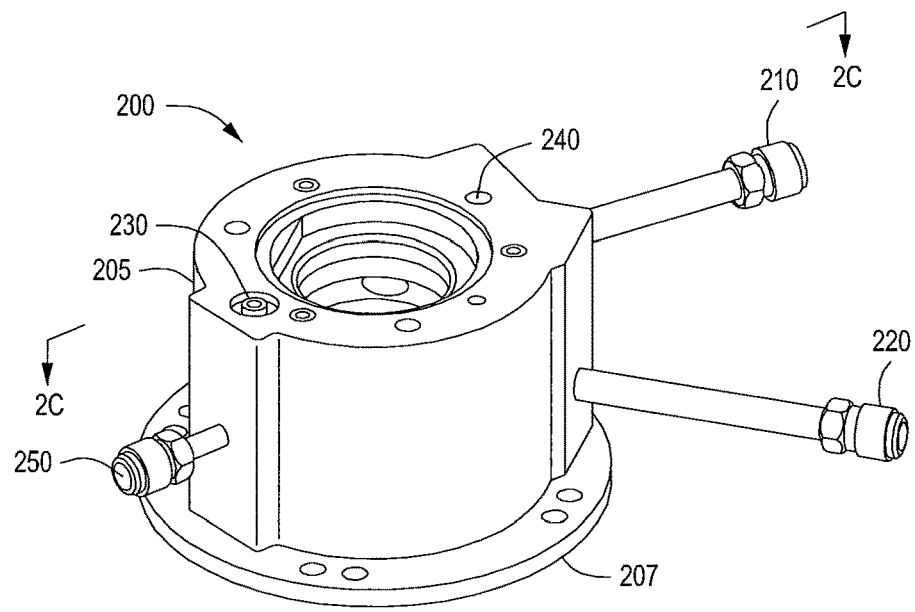
FIG. 2A depicts a perspective view of a housing for a lid assembly and a gas delivery apparatus adapted for atomic layer deposition in accordance with some embodiments of the present disclosure.
Figure 2B:
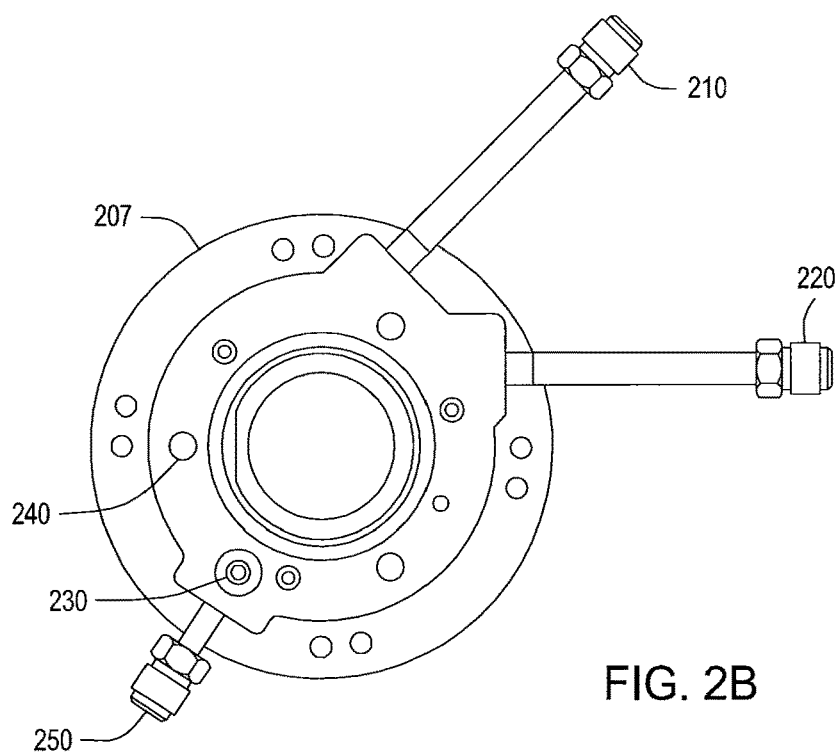
FIG. 2B depicts a top view of a housing for a lid assembly and a gas delivery apparatus from FIG. 2A in accordance with some embodiments of the present disclosure.
Figure 2C:
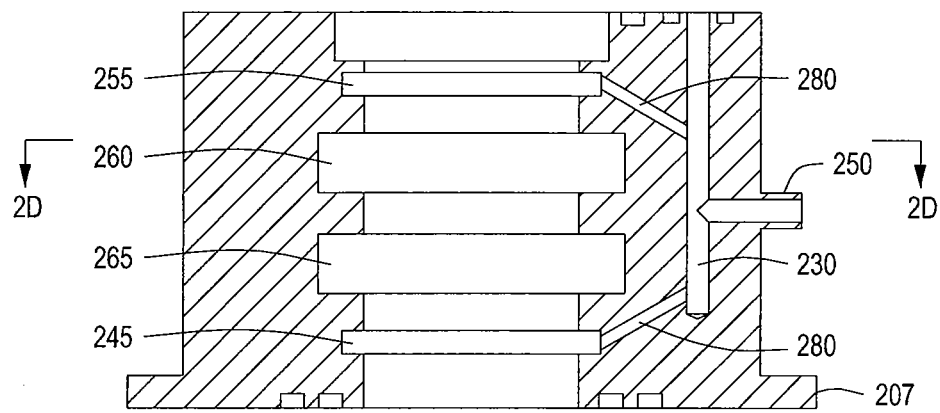
FIG. 2C depicts a schematic cross-sectional view of a lid assembly and a gas delivery apparatus from FIG. 2A in accordance with some embodiments of the present disclosure.
Figure 2D:
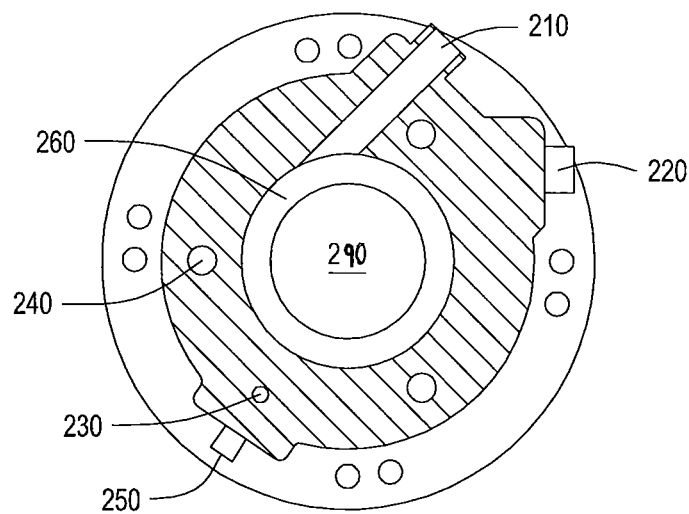
FIG. 2D depicts a schematic cross-sectional view of a lid assembly and a gas delivery apparatus from FIG. 2A in accordance with some embodiments of the present disclosure.

The housing 200 may comprise an annular manifold 205 disposed on a base 207. In embodiments as shown in FIGS. 2A-2G, the annular manifold 205 defines an inner region 290 and at least partially defines two or more annular channels disposed around the inner region 290. FIG. 2C is a cross-section view along line 2C of FIG. 2A. FIG. 2D is a cross-section view along line 2D of FIG. 2C. In an alternative embodiment, the annular manifold 205 defines an inner region 290 and includes an annular channel disposed around the inner region 290. FIG. 2F is another embodiment showing three fluid delivery lines and two annular channels. FIG. 2G is a cross-section view along line 2G of FIG. 2F.

The two or more annular channels are disposed in a vertically spaced manner from each other along the central axis 133 of the annular manifold 205. An annular channel, such as annular channel 260, comprises a channel adapted for flowing a fluid therein, and partially or completely surrounds the inner region 290. The annular channel may provide for fluid communication of up to 360° for the inner region, for example from 270° to 360°, around the inner region. Each annular channel allows for a fluid, such as a processing gas, to be delivered from a fluid source (e.g. a gas source) to the inner region for dispersing fluids through apertures formed in the insert 300 coupled with the annular manifold 205. Each of the annular channels may have various cross-section shapes and designs. For example, the annular channel may be a circular, half-circle, rectangular, or ellipsoidal cross-section design. Preferably, the cross-section design is adapted to provide for an effective flow of a fluid, such as a processing gas, from the annular channel to apertures coupled with the annular channel. For example, the annular channel may comprise three sides of a rectangular cross-section and the fourth side may be the vertical body 330 of the insert 300. In this manner, the three rectangular cross-section sides and the fourth side of the vertical body 330 of the insert 300 together define the annular channel.

Figure 2E:
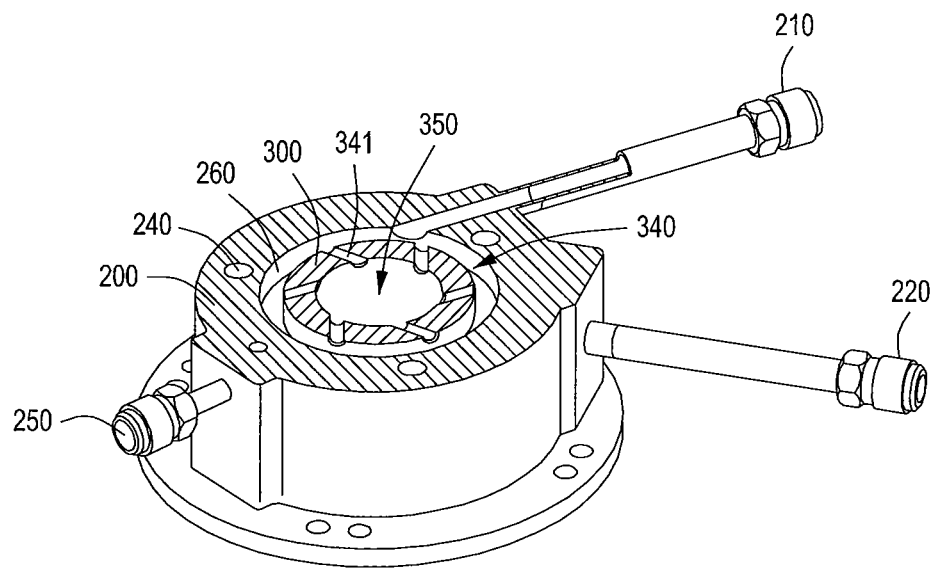
FIG. 2E depicts a perspective cross-sectional view of a lid assembly and a gas delivery apparatus from FIG. 1A in accordance with some embodiments of the present disclosure.
Figure 2F:
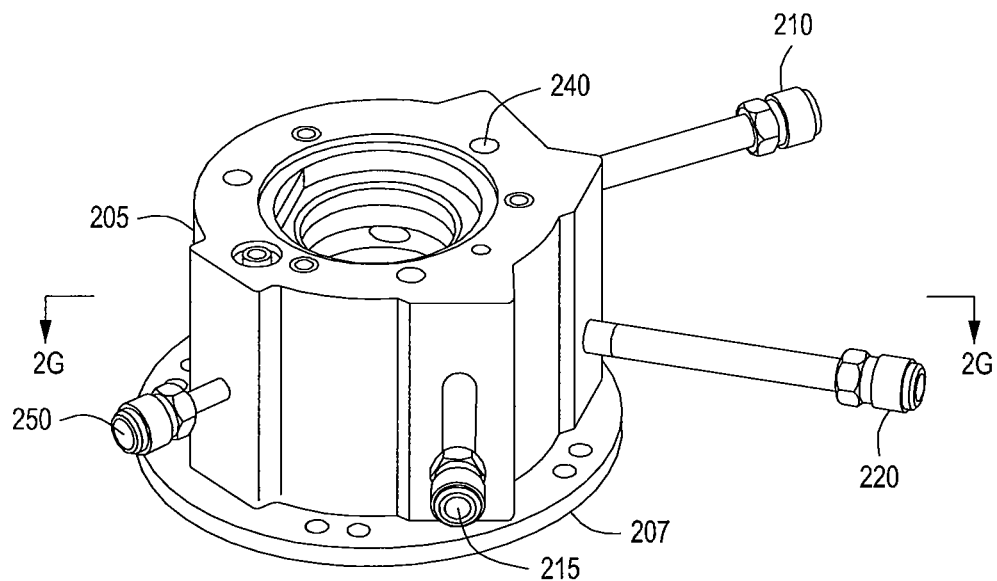
FIG. 2F depicts a schematic cross-sectional view of a lid assembly and a gas delivery apparatus in accordance with some embodiments of the present disclosure.
Figure 2G:
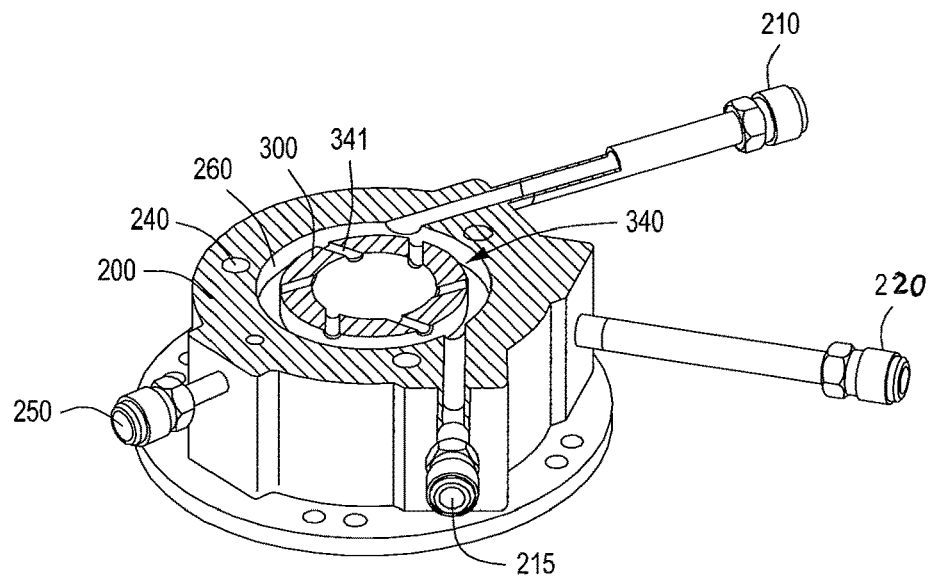
FIG. 2G depicts a perspective cross-sectional view of a lid assembly and a gas delivery apparatus from FIG. 2F in accordance with some embodiments of the present disclosure.

In one embodiment, each annular channel circumferentially spans the inner region 290, such as annular channel 260, and provides for fluid communication of 360° of the inner region, as shown in FIGS. 2D and 2E. In an alternative embodiment, one of the annular channels may have a fluid communication of 360° and at least a second annular channel of less than 360°. In one embodiment, a first annular channel 260 and a second annular channel 265 are disposed around the inner region 290. In another embodiment, the annular manifold 205 may include three annular channels 260, 265, 270 (shown in FIG. 1C).

Each of the annular channels is coupled with a respective fluid delivery line, such as fluid delivery lines 210, 215, 220, as shown in FIG. 1C. Alternatively, each of the annular channels may be coupled with two or more fluid delivery lines, such as shown in FIGS. 2F and 2G, which can provide for a mix of gases or alternative gases flowing though the annular channels. FIG. 2G shows fluid delivery lines 210 and 215 each coupled with annular channel 265.

Each of the fluid lines is coupled with a fluid source, such as a gas source. Alternatively, each of the fluid lines may be coupled with two or more gas sources, which can provide for a mix of gases or alternative gases flowing though the annular channels. The use of multiple annular channels may allow the supply of different precursors, such as hafnium chloride and water for a hafnium oxide deposition process, and/or allow the same precursor with different concentrations. Additionally, a plenum may supply different precursors including mixing precursors or alternating delivery of the precursors.

At least one purge line, such as purge line 250, may also be formed in the annular manifold 205. The purge line is introduced into a vertical portion of the annular manifold 205. The purge line comprises a horizontal gas transport line coupled with one or more gap purge lines 280, which are disposed to contact the inner region 290 above and below the series of annular channels. Each of the gap purge lines 280 at the inner region may have an extending annular channel, such as circumferentially formed annular channel 245, 255, formed at a surface of the annular manifold 205 disposed adjacent the inner region. The purge line 250 is also coupled with a vertically disposed line 230 disposed in the annular manifold 205. The one or more gap purge lines also provide flow of a purge gas along the vertical body 330 of the insert 300 to the material intersection 380 between the insert 300 and the material of the lid cap 172 forming the adjacent gas dispersing channel 134. The purge gas will further prevent processing gases from reacting with any structural sealing materials, such as o-rings 385, disposed between the housing and insert with the underlying material of the lid cap 172 and lid plate assembly forming the adjacent gas dispersing channel 134.

The purge line 250 may be connected to one of the purge gas sources as previously described for the processing chamber, and the purge gas may comprise a non-reactive gas, such as nitrogen or a noble gas. The purge line provides a purge gas between the inserts and the annular manifold 205 to remove unwanted processing gases in those areas. Thus, the purge gas protects sensitive materials from the processing gases, such as o-ring materials, that can degrade over time when exposed to the reactive processing gases, such as metal halide precursors.

Figure 3A:
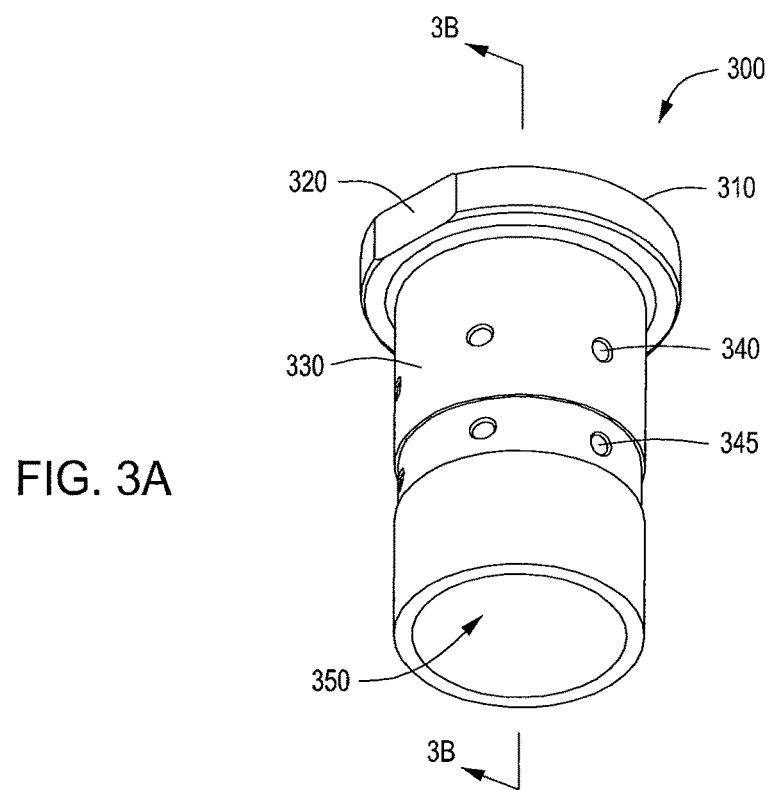
FIG. 3A depicts a perspective view of an insert for a lid assembly and a gas delivery apparatus adapted for atomic layer deposition in accordance with some embodiments of the present disclosure.
Figure 3B:
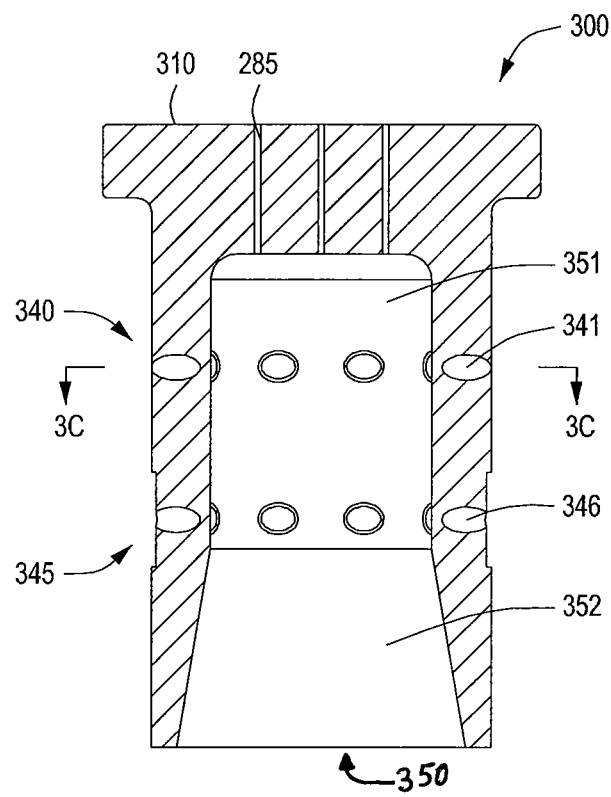
FIG. 3B depicts a schematic cross-sectional view of the insert depicted in FIG. 3A in accordance with some embodiments of the present disclosure.

Referring to FIGS. 3A-3D, an insert 300 is disposed in the inner region 290 and defines upper portion 350 of gas dispersing channel 134. The insert comprises a coupling lid 310 (400 in previous figures) having a truncated portion 320 adapted to be coupled to a top portion of the housing 200, and a vertical body 330 adapted to be disposed in and flush to the inside of the annular manifold 205. The vertical body 330 defines the upper portion 350. The upper portion may comprise a cylindrical shape or a substantially cylindrical shape. In one example, as shown in FIG. 3B, the upper portion 350 comprises a cylindrical upper portion 351 and an expanding bottom portion 352 with the expanding bottom portion 352 disposed below a bottom set of a plurality of apertures 346.

Figure 3C:
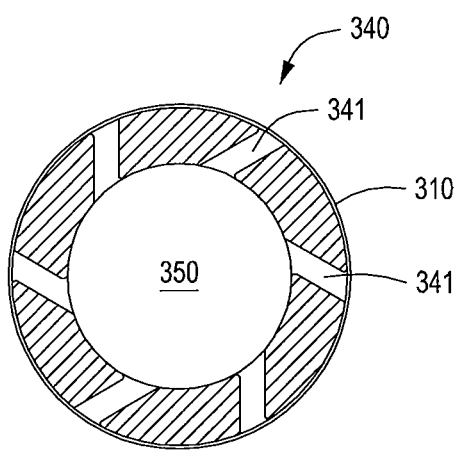
FIG. 3C depicts a schematic cross-sectional view of the lid assembly and a gas delivery apparatus in FIG. 3B in accordance with some embodiments of the present disclosure.

One or more gas inlets 340, 345 may be disposed in the vertical body of the insert 300. The gas inlets 340, 345 may comprise a plurality of apertures 341, 346 along a horizontal plane at a portion of the vertical body 330, thus forming multi-aperture gas inlets 340, 345. The number of apertures 341, 346 along each horizontal plane may be between 2 and 10 apertures, for example, 6 apertures as shown in FIGS. 3A-3C. One or more sets of the plurality of apertures may be formed along the insert 300. The apertures 341, 346 may be disposed equidistantly from each other around the horizontal plane of the vertical body 330. Alternatively, the apertures 341, 346 may be spaced and/or grouped to provide a desired gas flow characteristic into the upper portion 350. It is believed that apertures disposed equilaterally from each other around the horizontal plane of the vertical body 330 in combination with an upper portion 350 form equalization grooves, allowing for the same or substantially the same pressure and gas flow rates through each of the apertures 341, 346 to provide more uniform flow of process gases at the substrate surface.

Figure 3D:
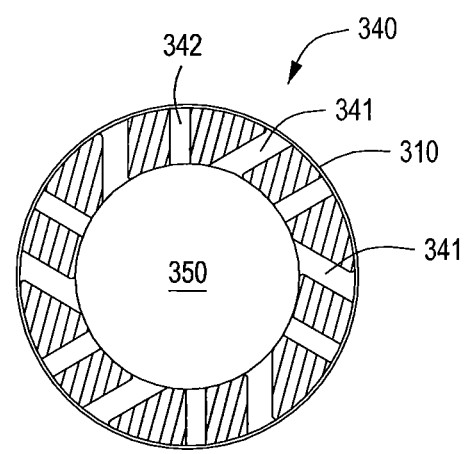
FIG. 3D depicts a schematic cross-sectional view of the lid assembly and a gas delivery apparatus in FIG. 3B in accordance with some embodiments of the present disclosure.

The apertures 341, 346 may be disposed at any angle relative to central axis 133, such as about tangential to central axis 133 or gas dispersing channel 134 and through the vertical body 330. The apertures 341, 346 may be oriented at different angles to the radial and vertical directions. The apertures 341, 346 can be angled from 0° to 90° with respect to horizontal to provide a desired flow characteristic. In some embodiments, apertures 341 and 346 are positioned at an angle tangential to upper portion 350 (as shown in FIG. 3C), and within a range of about 0° to about 90° from horizontal, or about 0° to about 60°, or about 0° to about 45°, or about 0° to about 20°. In some embodiments, the apertures 341 and 346 are positioned at angles both tangential and perpendicular (i.e., radial) to the upper portion 350 (as shown in FIG. 3D).

The apertures 341, 346 are fluidly coupled with the two or more annular channels 260, 265 of the annular manifold 205. Multiple sets of pluralities of the apertures may be used with each inlet corresponding to an annular channel formed in the annular manifold 205. The apertures may be of any cross-section shape, for example, a rectangular shape, a cylindrical tube, or a tear drop shape. It is believed that the combination of the annular channels and inlets having multiple apertures provides more uniform flow of process gases at the substrate surface.

The insert 300 may be made of material that is non-reactive with the processing and cleaning gases, such as $NF_3$ cleaning gases. One such material is aluminum. In the configuration shown in the figures, an aluminum insert is observed to have increased material compatibility, i.e., an aluminum insert has less reactivity with the $NF_3$ cleaning gases and other processing gases, such as water, than other materials, such as stainless steel. Additionally, the insert material may also be more compatible with other structural components of the chamber that the insert 300 may contact. For example, the lid cap 172 and portions of lid plate 170 surrounding the gas dispersing channel 134 may also be made of aluminum, with which an aluminum insert 300 would have a good material compatibility and be more structurally compatible for manufacturing and assembling.

It is believed that the lid cap described herein with the plurality of apertures (plurality of entry points) forming an inlet provides for more uniform flow of the processing gases over the substrate surface, thus providing a more uniform thickness in an annular direction as compared to a single entry point/single entry inlet. It was observed that a lower wafer-in-wafer (WiW) thickness can be achieved with an improved thickness uniformity with the multi-annular channel of the lid cap 172 assembly described herein along a 2 inch ring analysis, a 4 inch ring analysis, and at 3 mm from the substrate edge compared to single entry point/single entry inlet. Additionally, the multi-annular channel described herein has been observed to lower risk of back diffusion as compared to a single entry point/single entry inlet, allow for independent control of the processing gas through the separate lines, and provide for a heated inert gas purge to protect the o-rings as compared to a single entry point/single entry inlet. Additionally, the multi-annular channel allows the use of PVC valves to improve corrosion protection, provides a simplified hardware design, such as face seals replaced with VCR fittings, and eliminates components necessary for a single entry point/single entry inlet, which allows for improved serviceability as compared to a single entry point/single entry inlet.

FIGS. 1A-1B depict the pathway gases travel to a gas dispersing channel 134 as described in embodiments herein. Process gasses are delivered from fluid delivery lines 210 and 220 into annular channels 260 and 265, through gas inlets 340, 345, and into the upper portion 350 and through the gas dispersing channel 134. FIGS. 2D, 3B, and 3C illustrate a pathway for a process gas or precursor gas to travel, that is, from fluid delivery line 210 into annular channel 265, through gas inlet 340, and into the upper portion 350. A second pathway extends from fluid delivery line 220 into annular channel 260, through gas inlet 345, and into the upper portion 350, as depicted in FIGS. 1B, 2D, 3B, and 3C. In some embodiments, a third pathway extends from fluid delivery line 215 into annular channel 270, through gas inlet 370, and into the upper portion 350, as depicted in FIGS. 1C and 2F.

Although the exact gas flow pattern through the gas dispersing channel 134 is not known, it is believed that circular gas flow 174 (FIG. 1C) may travel from gas inlets 340, 345, 370 through gas dispersing channel 134 with a circular flow pattern, such as a vortex flow, a helix flow, a spiral flow, a swirl flow, a twirl flow, a twist flow, a coil flow, a corkscrew flow, a curl flow, a whirlpool flow, derivatives thereof, or combinations thereof. In one aspect, circular gas flow 174 may help to establish a more efficient purge of gas dispersing channel 134 due to the sweeping action of the vortex flow pattern across the inner surface of gas dispersing channel 134.

As mentioned above, the inventors have discovered that in some applications, the circular gas flow can lead to non-uniform processing results. As such, in some embodiments, the gas flows 174 may be more turbulent to provide enhanced mixing of two or more gases. FIG. 4A depicts an insert 300, which when inserted into the lid cap of an ALD chamber, defines three or more annular channels 402, 404, 406 between a vertical body 330 of the insert 300 and the lid cap. The annular channels 402, 404, 406 are substantially similar to the annular channels 260, 265, 270, described above. The annular channels 402, 404, 406 are fluidly coupled to a plurality of apertures 410, 420, 430, respectively. The number of apertures 410, 420, 430 along each horizontal plane may be between 2 and 10 apertures, for example, 6 apertures as shown in FIGS. 4B-4C. Similar to the apertures described above, each aperture within a respective plurality of apertures 410, 420, 430 may be disposed equidistantly from each other around the vertical body 330. In this embodiment however, at least one of the plurality of apertures 410, 420, 430 are arranged to create a rotational flow of a gas in an opposite direction as compared to at least one other of the plurality of apertures 410, 420, 430 (e.g., from the perspective shown in FIGS. 4B-C, at least one of the plurality of apertures is configured to provide a rotational flow in a first, for example clockwise, direction, and at least one of the plurality of apertures is configured to provide a rotational flow in a second, for example counterclockwise, direction). For example, as shown in FIGS. 4B-C, the plurality of apertures 410 direct gas flow in a counterclockwise direction, and the plurality of apertures 420 (and the plurality of apertures 430) direct gas flow in a clockwise direction. As a result of the counter-flow direction configuration of the pluralities of apertures 410, 420, 430, a turbulent gas flow 174 is created. The insert 300 may include a plurality of grooves 408 for placement of o-rings to ensure proper sealing between the insert 300 and the lid cap of the ALD chamber.

Figures 5A, 5B, 5C:
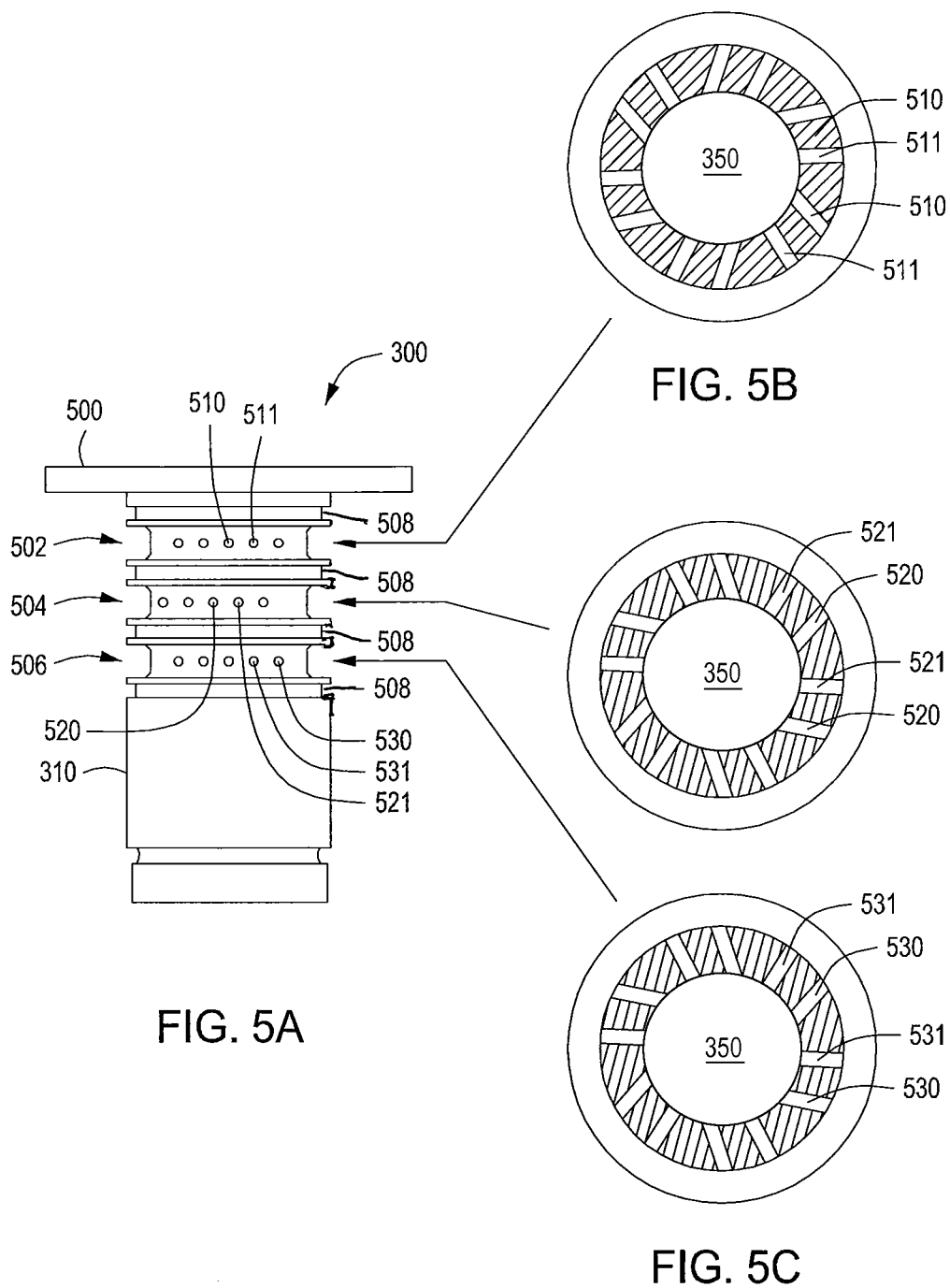
FIG. 5A depicts a side view of an insert for a lid assembly and a gas delivery apparatus adapted for atomic layer deposition in accordance with some embodiments of the present disclosure.
FIGS. 5B and 5C each depict cross-sectional top views of a horizontal cross-section of the insert of FIG. 5A in accordance with some embodiments of the present disclosure.

FIGS. 5A-5C depict an insert 300 in accordance with some embodiments of the present disclosure. The insert 300 of FIGS. 5A-5C is similar to that of FIGS. 4A-4C and includes a plurality of annular channels 502, 504, 506 that are fluidly coupled to a corresponding plurality of apertures 510, 520, and 530. In this embodiment, however, the insert 300 of FIGS. 5A-5C further includes a second plurality of apertures 511, 521, and 531 that are disposed adjacent to the plurality of apertures 510, 520, and 530. As shown in FIGS. 5B and 5C, the plurality of apertures 510, 520, and 530 are tangential to the upper portion 350 (i.e., tangential apertures) whereas the second plurality of apertures 511, 521, and 531 are perpendicular to, or radially aligned with a central axis of, the upper portion 350 (i.e., radial apertures). The inventors have discovered that introducing radial apertures 511, 521, 531 into the insert 300 advantageously improves processing uniformity by creating a gas flow 174 that is more turbulent to provide enhanced mixing of two or more gases. The radial apertures 511, 521, 531 may have a diameter that is the same as, or different than, the diameter of the tangential apertures 510, 520, 530 to advantageously control the amount of gas that flows through the radial apertures 511, 521, 531 as compared with the gas flow through the tangential apertures 510, 520, 530. For example, in some embodiments, the radial apertures 511, 521, 531 may have a smaller diameter than the tangential apertures 510, 520, 530. In some embodiments, the radial apertures 511, 521, 531 may have a larger diameter than the tangential apertures 510, 520, 530. The insert 300 may include a plurality of grooves 508 for placement of o-rings to ensure proper sealing between the insert 300 and the lid cap of the ALD chamber.

FIG. 1A depicts that at least a portion of lower surface 160 of chamber lid assembly 132 may be contoured or angled downwardly and outwardly from a central opening coupled to the gas dispersing channel 134 to a peripheral portion of chamber lid assembly 132 to help provide an improved velocity profile of a gas flow from gas dispersing channel 134 across the surface of substrate 110 (i.e., from the center of the substrate to the edge of the substrate). Lower surface 160 may contain one or more surfaces, such as a straight surface, a concave surface, a convex surface, or combinations thereof. In one embodiment, lower surface 160 is convexly funnel-shaped.

In one example, lower surface 160 is downwardly and outwardly sloping toward an edge of the substrate receiving surface 111 to help reduce the variation in the velocity of the process gases traveling between lower surface 160 of chamber lid assembly 132 and substrate 110 while assisting to provide uniform exposure of the surface of substrate 110 to a reactant gas. In one embodiment, the ratio of the maximum area of the flow section over the minimum area of the flow section between a downwardly sloping lower surface 160 of chamber lid assembly 132 and the surface of substrate 110 is less than about 2, preferably, less than about 1.5, more preferably, less than about 1.3, and more preferably, about 1.

Not wishing to be bound by theory, it is believed that a gas flow traveling at a more uniform velocity across the surface of substrate 110 helps provide a more uniform deposition of the gas on substrate 110. It is believed that the velocity of the gas is directly proportional to the concentration of the gas which is in turn directly proportional to the deposition rate of the gas on substrate 110 surface. Thus, a higher velocity of a gas at a first area of the surface of substrate 110 versus a second area of the surface of substrate 110 is believed to provide a higher deposition of the gas on the first area. It is believed that chamber lid assembly 132 having lower surface 160, downwardly sloping, provides for more uniform deposition of the gas across the surface of substrate 110 because lower surface 160 provides a more uniform velocity and, thus, a more uniform concentration of the gas across the surface of substrate 110.

Various methods may also be employed to process a substrate in accordance with embodiments of the present disclosure. In some embodiments, a method of processing a substrate includes flowing two or more reactant, or process, gases from one or more fluid sources, such as gas sources 138, 139, through fluid delivery lines 210, 220 of a chamber lid assembly 132. The two or more process gases flow from the fluid delivery lines 210, 220 through two or more annular channels 260, 265 at least partially defined by a housing 200 of the chamber lid assembly 132. The housing has an inner region 290. The two or more process gases flow from the two or more annular channels 260, 265 through an insert 300 disposed in the inner region 290 and into an upper portion 350 of a gas dispersing channel 134 in the chamber lid assembly 132. The insert 300 has a central passageway that at least partially defines the upper portion 350 of the gas dispersing channel 134. The one or more process gases flow through the gas dispersing channel 134 and into a reaction zone 164 above a substrate 110 disposed on a substrate support 112.

FIG. 1A depicts choke 162 located at a peripheral portion of chamber lid assembly 132 adjacent the periphery of substrate 110. Choke 162, when chamber lid assembly 132 is assembled to form a processing zone around substrate 110, contains any member restricting the flow of gas therethrough at an area adjacent the periphery of substrate 110.

In one specific embodiment, the spacing between choke 162 and substrate support 112 is between about 0.04 inches and about 2.0 inches, and preferably between about 0.04 inches and about 0.2 inches. The spacing may vary depending on the gases being delivered and the process conditions during deposition. Choke 162 helps provide a more uniform pressure distribution within the volume or reaction zone 164 defined between chamber lid assembly 132 and substrate 110 by isolating reaction zone 164 from the non-uniform pressure distribution of pumping zone 166 (FIG. 1A).

As explained above, the chamber lid assembly 132 includes a first heating element (one or more cartridge heaters 240 in the housing 200) to heat the gas dispersing channel 134 and a second heater element (the heater plate 198 coupled to the upper surface of the lid plate 170) disposed radially outward of the first heating element to heat the lid plate 170 (e.g., the lower surface 160 of the lid plate 170). Controlling the temperature of chamber lid assembly 132 may be used to prevent gas decomposition, deposition, or condensation on chamber lid assembly 132. In some embodiments, components of chamber lid assembly 132 may be individually heated. In some embodiments, components of the chamber lid assembly 132 are simultaneously heated. For example, referring to FIG. 1A, chamber lid assembly 132 may contain lid plate 170 and lid cap 172 in which lid plate 170 and lid cap 172 form gas dispersing channel 134. Lid cap 172 may be maintained at one temperature range and lid plate 170 may be maintained at another temperature range or the two components may be heated at the same temperature range.

The components and parts of chamber lid assembly 132 may contain materials such as stainless steel, aluminum, nickel-plated aluminum, nickel, alloys thereof, or other suitable materials. In one embodiment, lid cap 172 and lid plate 170 may be independently fabricated, machined, forged, or otherwise made from a metal, such as aluminum, an aluminum alloy, steel, stainless steel, alloys thereof, or combinations thereof.

In some embodiments, inner surface 131 of gas dispersing channel 134 (including both inner surfaces of lid plate 170 and lid cap 172) and lower surface 160 of chamber lid assembly 132 may contain a mirror polished surface to help a flow of a gas along gas dispersing channel 134 and lower surface 160 of chamber lid assembly 132. In some embodiments, the inner surface of fluid delivery lines 210 and 220 may be electropolished to help produce a laminar flow of a gas therethrough.

FIG. 1A depicts control unit 180, such as a programmed personal computer, work station computer, or the like, coupled to process chamber 100 to control processing conditions. For example, control unit 180 may be configured to control the chamber cleaning system and the chamber lid assembly to flow various reactant gases and purge gases from gas sources 138, 139, and 140 through valves 142A and 142B during different stages of a substrate process sequence. Illustratively, control unit 180 contains central processing unit (CPU) 182, support circuitry 184, and memory 186 containing associated control software 183.

Control unit 180 may be one of any form of general purpose computer processor that can be used in an industrial setting for controlling various chambers and sub-processors. CPU 182 may use any suitable memory 186, such as random access memory, read only memory, floppy disk drive, hard disk, or any other form of digital storage, local or remote. Various support circuits may be coupled to CPU 182 for supporting process chamber 100. Control unit 180 may be coupled to another controller that is located adjacent individual chamber components, such as programmable logic controllers 148A, 148B of valves 142A, 142B. Bi-directional communications between the control unit 180 and various other components of process chamber 100 are handled through numerous signal cables collectively referred to as signal buses 188, some of which are illustrated in FIG. 1A. In addition to control of reactant gases and purge gases from gas sources 138, 139, 140 and from programmable logic controllers 148A, 148B of valves 142A, 142B, control unit 180 may be configured to be responsible for automated control of other activities used in wafer processing-such as wafer transport, temperature control, chamber evacuation, among other activities, some of which are described elsewhere herein.

Referring to FIGS. 1A-1C, in a processing operation, substrate 110 is delivered to process chamber 100 through slit valve 108 by a robot (not shown). Substrate 110 is positioned on substrate support 112 through cooperation of lift pins 120 and the robot. Substrate support 112 raises substrate 110 into close opposition to lower surface 160 of chamber lid assembly 132. A first gas flow may be injected into gas dispersing channel 134 of process chamber 100 by valve 142A together or separately (i.e., pulses) with a second gas flow injected into process chamber 100 by valve 142B. The first gas flow may contain a continuous flow of a purge gas from purge gas source 140 and pulses of a reactant gas from reactant gas source 138 or may contain pulses of a reactant gas from reactant gas source 138 and pulses of a purge gas from purge gas source 140. The second gas flow may contain a continuous flow of a purge gas from purge gas source 140 and pulses of a reactant gas from reactant gas source 139 or may contain pulses of a reactant gas from reactant gas source 139 and pulses of a purge gas from purge gas source 140.

Gas flow 174 travels through gas dispersing channel 134 as a turbulent flow which provides an enhanced mixing through the gas dispersing channel 134. The turbulent gas flow 174 dissipates to a downward flow towards the surface of substrate 110. The velocity of the gas flow reduces as it travels through gas dispersing channel 134. The gas flow then travels across the surface of substrate 110 and across lower surface 160 of chamber lid assembly 132. Lower surface 160 of chamber lid assembly 132, which is downwardly sloping, helps reduce the variation of the velocity of the gas flow across the surface of substrate 110. The gas flow then travels by choke 162 and into pumping zone 166 of process chamber 100. Excess gas, by-products, etc. flow into the pumping channel 179 and are then exhausted from process chamber 100 by vacuum system 178. Throughout the processing operation, the one or more cartridge heaters 240 and the heater plate 198 heat the chamber lid assembly 132 to a predetermined temperature to heat any solid byproducts that have accumulated on walls of the process chamber 100 (or a processing kit disposed in the chamber). As a result, any accumulated solid byproducts are vaporized. The vaporized byproducts are evacuated by vacuum system 178 and pumping channel 179. In some embodiments, the predetermined temperature is greater than or equal to 150° C.

Figure 6:
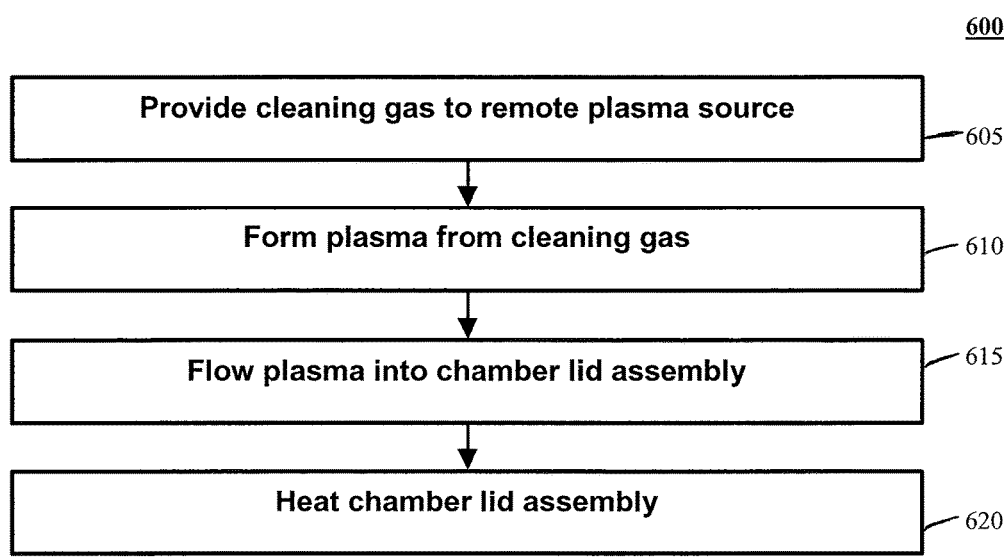
FIG. 6 depicts a flowchart illustrating a method of cleaning a process chamber in accordance to some embodiments of the present disclosure.

FIG. 6 depicts a flowchart illustrating a cleaning operation 600 in accordance with some embodiments of the present disclosure. Referring also to FIGS. 1A-1C, at 605, a cleaning gas (e.g., NF$_3$) is flowed from the cleaning gas source 197 into the RPS 190. At 610, a plasma is formed from the cleaning gas. At 615, the plasma is then flowed through the inner channel 193 of the isolation collar 192 into the gas dispersing channel 134 and the reaction zone 164. Ions from the plasma subsequently bombard the surfaces surrounding the gas dispersing channel 134 and the reaction zone 164 to get rid of any remaining byproducts that have accumulated on those surfaces. At 620 (and throughout the cleaning operation 600), the one or more cartridge heaters 240 and the heater plate 198 heat the chamber lid assembly 132 to a predetermined temperature to heat any solid byproducts that have accumulated on walls of the process chamber 100 (or a processing kit disposed in the chamber). As a result, any accumulated solid byproducts are vaporized. The vaporized byproducts are evacuated by vacuum system 178 and pumping channel 179. In some embodiments, the predetermined temperature is greater than or equal to 150° C.

Process chamber 100, as illustrated in FIGS. 1A-1B, has been described herein as having a combination of features. In one aspect, process chamber 100 provides reaction zone 164 containing a small volume in compared to a conventional CVD chamber. Process chamber 100 uses a smaller amount of a gas, such as a reactant gas or a purge gas, to fill reaction zone 164 for a particular process. In another aspect, process chamber 100 provides chamber lid assembly 132 having a downwardly and outwardly sloping or funnel shaped lower surface (lower surface 160) to reduce the variation in the velocity profile of a gas flow traveling between the bottom surface of chamber lid assembly 132 and substrate 110. In still another aspect, process chamber 100 provides gas dispersing channel 134 to reduce the velocity of a gas flow introduced therethrough. In still another aspect, process chamber 100 provides fluid delivery lines at an angle α from the center of gas dispersing channel 134. Process chamber 100 provides other features as described elsewhere herein. Other embodiments of a chamber adapted for atomic layer deposition incorporate one or more of these features.

Although in the above description the annular channels 260, 265, 270 are defined by the insert and the adjacent lid cap, the annular channels 260, 265, 270 may alternatively be formed in other elements.

While the foregoing is directed to some embodiments of the present disclosure, other and further embodiments may be devised without departing from the basic scope thereof.

What is claimed is:

1. A chamber lid assembly, comprising:
   a housing enclosing a central channel that extends along a central axis and has an upper portion and a lower portion;
   a lid plate with an upper surface comprising a planar exterior wall of a process chamber coupled directly to a lower surface of the housing and having a contoured bottom surface that extends downwardly and outwardly from a central opening coupled to the lower portion of the central channel to a peripheral portion of the lid plate, wherein a first portion of the contoured bottom surface where the contoured bottom surface meets the central channel is conical and has a first angle with respect to the central axis, wherein a second portion of the contoured bottom surface radially outward of the first portion is also conical and has a second angle with respect to the central axis, and wherein the second angle is different than the first angle;
   a first heating element to heat the central channel;
   a second heating element coupled directly to the upper surface of the lid plate and configured to heat the contoured bottom surface of the lid plate by disseminating heat through the lid plate directly to the contoured bottom surface of the lid plate which is configured to be exposed to a reaction zone;
   a remote plasma source fluidly coupled to the central channel; and
   an isolation collar coupled between the remote plasma source and the housing, wherein the isolation collar has an inner channel extending through the isolation collar to fluidly couple the remote plasma source and the central channel.

2. The chamber lid assembly of claim 1, wherein the first heating element comprises one or more cartridge heaters disposed in the housing; and wherein the second heating element comprises a heater plate coupled to the upper surface of the lid plate.

3. The chamber lid assembly of claim 1, wherein the housing includes an inner region and at least partially defines a first annular channel and a second annular channel, wherein the first and second annular channels are fluidly coupled to the central channel; and further comprising:

an insert disposed in the inner region and extending to the upper surface of the lid plate, the insert having a central passageway that at least partially defines the central channel, wherein the insert includes a first plurality of apertures and a second plurality of apertures, wherein the first plurality of apertures are disposed along a first horizontal plane to provide a multi-aperture inlet between the first annular channel and the central channel, wherein the second plurality of apertures are disposed along a second horizontal plane to provide a multi-aperture inlet between the second annular channel and the central channel.

4. The chamber lid assembly of claim 3, wherein each aperture of the first plurality of apertures is angled with respect to the central axis so as to induce a flow of a gas about the central axis in a first rotational direction, and
wherein each aperture of the second plurality of apertures is angled with respect to the central axis so as to induce a flow of a gas about the central axis in a second rotational direction opposite the first rotational direction.

5. The chamber lid assembly of claim 3, further comprising:
a thermal isolation ring disposed between the isolation collar and the insert to minimize a contact area between the isolation collar and the insert.

6. The chamber lid assembly of claim 5, wherein the thermal isolation ring is formed of stainless steel.

7. The chamber lid assembly of claim 3, wherein the insert is monolithic and includes a cap disposed at an upper portion of the insert that covers a top surface of the housing, and wherein the cap includes a plurality of holes formed in a central portion of the cap, the plurality of holes fluidly coupling the inner channel of the isolation collar and the central channel.

8. The chamber lid assembly of claim 3, wherein the first plurality of apertures and the second plurality of apertures each include radial apertures and tangential apertures.

9. The chamber lid assembly of claim 1, further comprising:
a cleaning gas source coupled to the remote plasma source to supply the remote plasma source with a cleaning gas.

10. The chamber lid assembly of claim 9, wherein the cleaning gas is nitrogen trifluoride.

11. The chamber lid assembly of claim 1, wherein the isolation collar is formed of aluminum.

12. The chamber lid assembly of claim 1:
wherein the first heating element comprises one or more cartridge heaters disposed in the housing;
wherein the second heating element comprises a heater plate coupled to an upper surface of the lid plate;
wherein the housing includes an inner region and at least partially defines a first annular channel and a second annular channel, and wherein the first and second annular channels are fluidly coupled to the central channel;
and further comprising:
an insert disposed in the inner region and extending to the upper surface of the lid plate, the insert having a central passageway that at least partially defines the central channel, wherein the insert includes a first plurality of apertures and a second plurality of apertures, wherein the first plurality of apertures are disposed along a first horizontal plane to provide a multi-aperture inlet between the first annular channel and the central channel, wherein the second plurality of apertures are disposed along a second horizontal plane to provide a multi-aperture inlet between the second annular channel and the central channel; and
a thermal isolation ring disposed between the isolation collar and the insert to minimize a contact area between the isolation collar and the insert.

13. A substrate processing chamber, comprising:
a chamber body; and
a chamber lid assembly coupled to the chamber body to define a processing volume within the chamber body and beneath the chamber lid assembly, wherein the chamber lid assembly comprises:
a housing enclosing a central channel that extends along a central axis and has an upper portion and a lower portion;
a lid plate with an upper surface comprising a planar exterior wall of the substrate processing chamber coupled directly to a lower surface of the housing and having a contoured bottom surface that extends downwardly and outwardly from a central opening coupled to the lower portion of the central channel to a peripheral portion of the lid plate, wherein a first portion of the contoured bottom surface where the contoured bottom surface meets the central channel is conical and has a first angle with respect to the central axis, wherein a second portion of the contoured bottom surface radially outward of the first portion is also conical and has a second angle with respect to the central axis, and wherein the second angle is different than the first angle;
a first heating element to heat the central channel;
a second heating element coupled directly to the upper surface of the lid plate and configured to heat the contoured bottom surface of the lid plate by disseminating heat through the lid plate directly to the contoured bottom surface of the lid plate which is configured to be exposed to a reaction zone;
a remote plasma source fluidly coupled to the central channel; and
an isolation collar coupled between the remote plasma source and the housing, wherein the isolation collar has an inner channel extending through the isolation collar to fluidly couple the remote plasma source and the central channel.

14. The substrate processing chamber of claim 13, wherein the first heating element comprises one or more cartridge heaters disposed in the housing; and wherein the second heating element comprises a heater plate coupled to the upper surface of the lid plate.

15. The substrate processing chamber of claim 13, wherein the housing includes an inner region and at least partially defines a first annular channel and a second annular channel, wherein the first and second annular channels are fluidly coupled to the central channel; and further comprising:
an insert disposed in the inner region and extending to the upper surface of the lid plate, the insert having a central passageway that at least partially defines the central channel, wherein the insert includes a first plurality of apertures and a second plurality of apertures, wherein the first plurality of apertures are disposed along a first horizontal plane to provide a multi-aperture inlet between the first annular channel and the central channel, wherein the second plurality of apertures are disposed along a second horizontal plane to provide a multi-aperture inlet between the second annular channel and the central channel.

16. The substrate processing chamber of claim 15, wherein each aperture of the first plurality of apertures is angled with respect to the central axis so as to induce a flow of a gas about the central axis in a first rotational direction, and
wherein each aperture of the second plurality of apertures is angled with respect to the central axis so as to induce a flow of a gas about the central axis in a second rotational direction opposite the first rotational direction.

17. The substrate processing chamber of claim 15, wherein the chamber lid assembly further comprises:
a thermal isolation ring disposed between the isolation collar and the insert to minimize a contact area between the isolation collar and the insert.

18. The substrate processing chamber of claim 15, wherein the insert is monolithic and includes a cap disposed at an upper portion of the insert that covers a top surface of the housing, and wherein the cap includes a plurality of holes formed in a central portion of the cap, the plurality of holes fluidly coupling the inner channel of the isolation collar and the central channel of the chamber lid assembly.

* * * * *